US005617040A

United States Patent [19]

Matthews

[11] Patent Number: 5,617,040
[45] Date of Patent: *Apr. 1, 1997

[54] PROGRAMMABLE OUTPUT DEVICE WITH INTEGRATED CIRCUIT

[75] Inventor: Wallace E. Matthews, Richardson, Tex.

[73] Assignee: Benchmarq Microelectronics, Inc., Dallas, Tex.

[*] Notice: The term of this patent shall not extend beyond the expiration date of Pat. No. 5,477,166.

[21] Appl. No.: 575,096

[22] Filed: Dec. 19, 1995

Related U.S. Application Data

[63] Continuation of Ser. No. 450,220, May 25, 1995, Pat. No. 5,477,166, which is a continuation of Ser. No. 52,134, Apr. 22, 1993, abandoned.

[51] Int. Cl.$^6$ ............................................. H03K 19/177
[52] U.S. Cl. ............................................. 326/38; 326/83
[58] Field of Search ............................ 326/38, 83, 121

[56] References Cited

U.S. PATENT DOCUMENTS

| | | | |
|---|---|---|---|
| 4,721,868 | 1/1988 | Cornell et al. | 326/38 |
| 4,972,100 | 11/1990 | Lim | 326/86 |
| 4,987,325 | 1/1991 | Seo | 326/50 |
| 4,990,800 | 2/1991 | Lee | 326/41 |
| 4,991,085 | 2/1991 | Pleva et al. | 326/82 |
| 5,027,011 | 6/1991 | Steele | 326/38 |
| 5,030,821 | 7/1991 | Fukuyama | 327/514 |
| 5,051,622 | 9/1991 | Pleva | 326/38 |
| 5,084,635 | 1/1992 | Toda et al. | 326/37 |
| 5,148,048 | 9/1992 | Kawasaki et al. | 326/26 |
| 5,198,707 | 3/1993 | Nicolai | 326/98 |
| 5,216,293 | 1/1993 | Sei et al. | 326/27 |

Primary Examiner—Edward P. Westin
Assistant Examiner—Benjamin D. Driscoll
Attorney, Agent, or Firm—Gregory M. Howison

[57] ABSTRACT

An integrated circuit with programmable output drive/program pins includes a plurality of output pads (30) which are each operable to interface with a separate and dedicated output driver (38). The output driver (38) is operable to drive an LED output device (14) in an operating mode. In a program mode, the driver (38) is disabled and a program buffer (40) enabled. At the same time, the LED output device (14) is disabled such that no impedance is presented to the output pad (30) due to operation of the LED output device (14). A programming resistor (18) is disposed between the pad (30) and one of three program reference voltages. A first program state is represented when the resistor (18) is tied to ground, a second program state is represented when the resistor (18) is tied to an open circuit and a third program state is represented when the resistor (18) is tied to a positive voltage. The program buffer (40) senses the presence of the resistor and what voltage it is tied to by either sinking current to the pad (30) or sourcing current therefrom. Therefore, the resistor (18) can be disposed on the pad (30) during operation and a power on reset or any type of external reset controlling a CPU (46) to initiate the program operation.

2 Claims, 4 Drawing Sheets

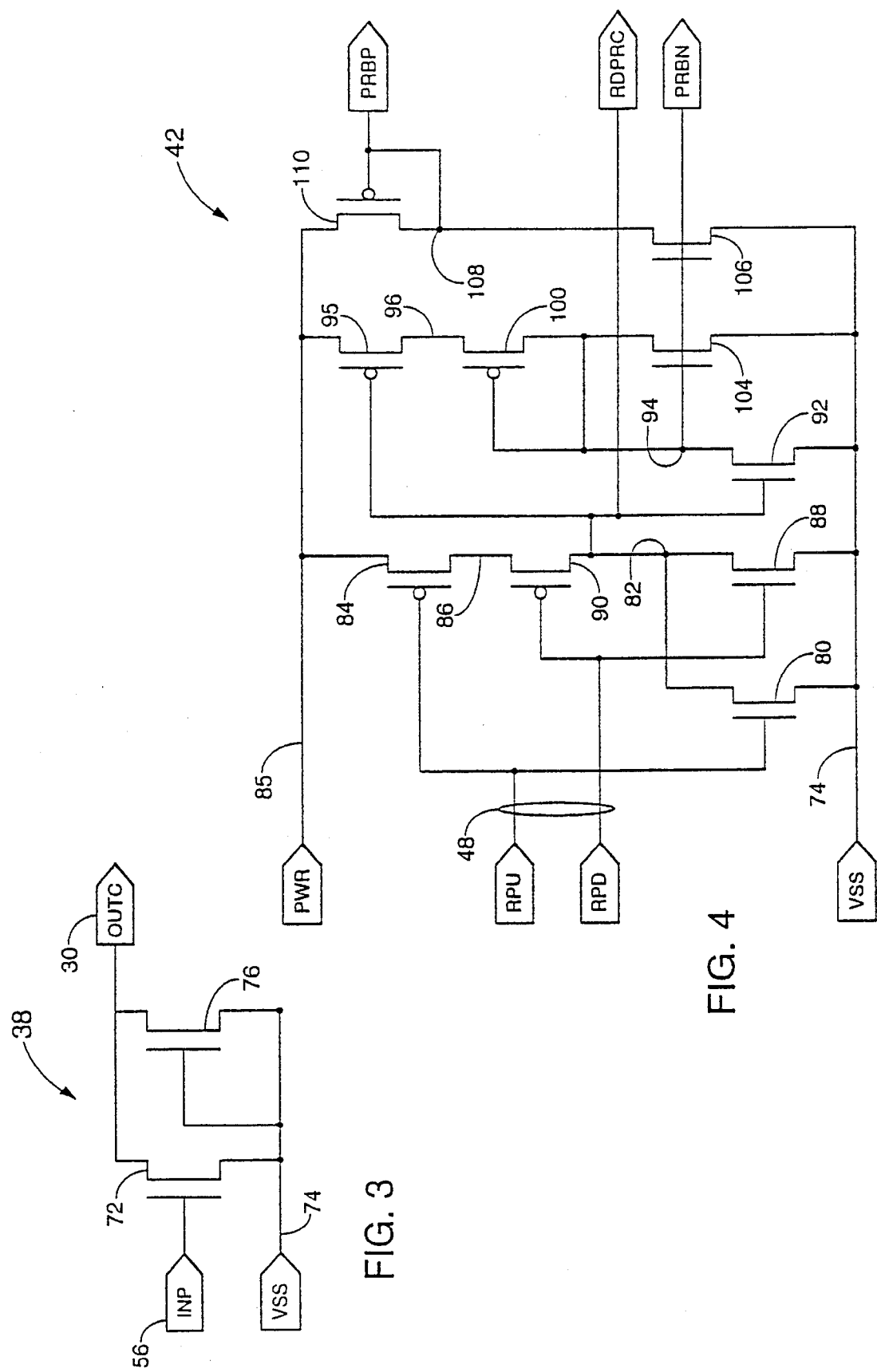

PROGRAMMABLE OUTPUT DEVICE WITH INTEGRATED CIRCUIT

IN THE CROSS REFERENCE TO RELATED APPLICATIONS

This application is a Continuation of Ser. No. 450,220, filed May 25, 1995, now U.S. Pat. No. 5,477,166, issued December 19, 1995, entitled "Programmable Output Device the Integrated Circuit", which is a Continuation of U.S. patent application Ser. No. 08/052,134, filed Apr. 22, 1993, now abandoned.

TECHNICAL FIELD OF THE INVENTION

The present invention pertains in general to multiplexing the function of the output pins on an integrated circuit and, more particularly, to utilizing the output pins of an integrated circuit to both drive an external device and also receive programming inputs thereon.

BACKGROUND OF THE INVENTION

Due to the increasing density of integrated circuits and the increasing number of functions that are integrated into the integrated circuit, each pin associated with a packaged device is utilized to serve multiple functions. For example, some integrated circuits are operated in a test mode or in an operating mode. In the test mode, the operating mode is disabled and signals input thereto are then recognized as being test signals. Typically, one pin is dedicated to selecting the test mode or the operating mode. Thereafter, input pins can typically serve two different input functions. When the pins are used in programming applications with three-state inputs, typically small impedances are utilized. For example, the pin is allowed to float or be connected directly to the positive or negative rail.

Although output driver pins have been utilized for input/output functions, these functions are typically separate operations, i.e., the output device is driven by the pin, and an output function is typically not present when an input signal is applied thereto. This is due to the fact that the impedance presented to the pin by the output device interferes with the input function. Further, the input function typically also requires a low impedance. For example, if an input required a low logic state signal to be applied thereto, the signal could not be applied thereto while the active device was attached, as this may cause excessive current to flow through the active device and may, in fact, turn the active device on if it were some device such as a display element.

SUMMARY OF THE INVENTION

The present invention disclosed and claimed herein comprises a method and apparatus for programming an integrated circuit through an output pin, which output pin operates in a programming mode and in an operating mode. In the operating mode, the output pin has associated therewith a driver for driving the output pin. In the program mode, an output programming device is provided for selectively disposing a programming impedance between the output pin and an external voltage reference or disposing no programming impedance between the output pin and any reference voltage. The presence of a programming impedance indicates a first program state and the presence of no programming impedance indicates a second program state. A program buffer is provided for determining in a program mode whether the programming impedance is present, indicating the presence of the first program state, or whether no programming impedance is present, indicating whether the second program state is present. A controller is operable to read the first and second program states and select the program mode or the operating mode.

In another aspect of the present invention, there are three program states provided. The first and second program states are provided by disposing a separate programming impedance between either an external positive voltage and the output pin or a negative voltage and the output pin. The third program state is present when no programming impedance is disposed between the output pin and any external reference voltage. The program buffer is operable to determine which of the programming impedances is present or if no programming impedance is present, the first, second and third program states determined by the controller. The presence of the programming impedance is determined by either sinking current to the output pin or sourcing current therefrom. During the sourcing step, the voltage on the output pin is measured and, if it falls, this indicates the presence of the programming impedance disposed between the output pin and the negative voltage. If no programming impedance is present or if a programming impedance is connected between the external pin and a positive voltage, the voltage will rise.

In the step of sinking current from the output pin, the voltage is sensed and, as the voltage rises, this indicates that the programming impedance is connected to the external positive reference voltage. If the voltage falls, either the programming impedance is connected to the negative reference voltage or no programming impedance is present. By monitoring the voltages during both the current sourcing operation and the current sinking operation, one of the program states can be determined.

In a further aspect of the present invention, the output device is disabled during the program mode to insure that no programming impedance is presented to the output pin by the output device. The output device is operable to have current sunk therefrom by the driver during the operating mode and, during the program mode, the driver is disabled and the output device is isolated from a voltage supply such that it presents a high impedance to the output pin.

BRIEF DESCRIPTION OF THE DRAWINGS

For a more complete understanding of the present invention and the advantage thereof, reference is now made to the following description taken in conjunction with the accompanying Drawings in which:

FIG. 3 illustrates a detailed schematic of the output driver;

FIG. 4 illustrates a detailed schematic diagram of the bias circuit for the program buffer;

DETAILED DESCRIPTION OF THE INVENTION

Figure 1:
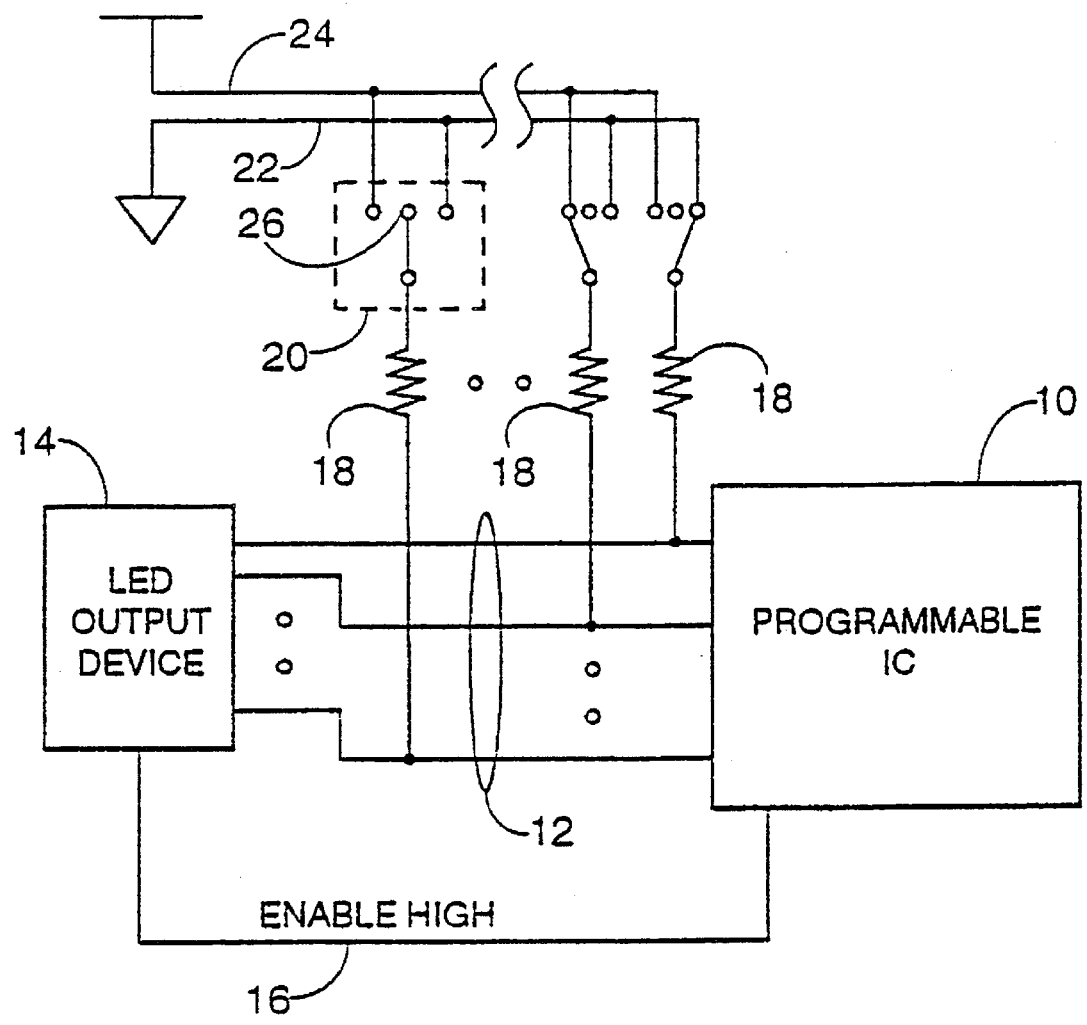
FIG. 1 illustrates an overall block diagram of the integrated circuit and associated output driven devices, with the programming resistors attached to the output drive/program pins.

Referring now to FIG. 1, there is illustrated an overall block diagram of an integrated circuit 10 utilizing the programmable output pins in accordance with one aspect of the present invention. The programmable IC 10 has a plurality of output lines 12 associated with a separate-group of output drive/program pins. In the illustrated example of FIG. 1, the output driver lines 12 are input to an LED output device 14, which output device 14 is an LED display. The LED output device 14 has an Enable High line 16 connected thereto which is output from one pin of the programmable IC 10.

Each of the output lines 12 is operable to have a programming resistor 18 associated therewith. Each of the resistors 18 is connected to a switch 20. The switch 20 is operable to be connected to one of three states, either to a ground line 22, a $V_{cc}$ line 24 or a floating node 26. Although the switch 20 is illustrated, it should be understood that, in the preferred embodiment, the resistor is either tied to ground, tied to $V_{cc}$ or left out of the circuit. Therefore, a resistor will be disposed on the output line that will either be a pull up resistor, a pull down resistor, or no resistor. The resistor 18 has a value of approximately 500 KOhms. By placing the resistors 18 on the appropriate one of the lines 12, the line can be programmed with three separate states, high, low and floating.

Figure 2:
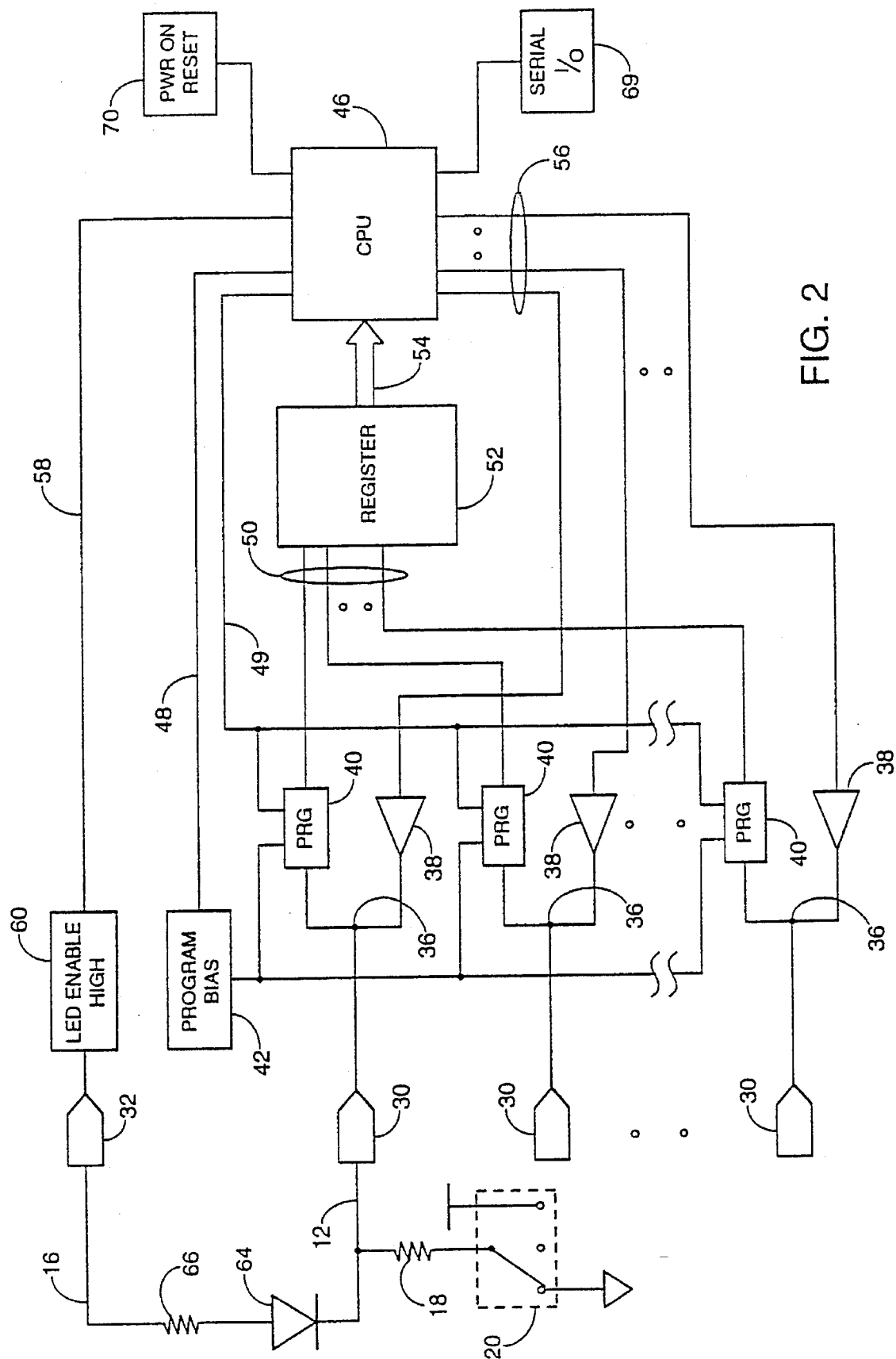
FIG. 2 illustrates a detail of a logic diagram for the programmable output drive/program pins.

Referring now to FIG. 2, there is illustrated a detailed block diagram of the driver portion of the programmable IC 10. A plurality of output drive/program pads 30 are provided, one associated with each of the driver lines 12. Additionally, an enable pin 32 is provided which is connected to the Enable High line 16. Each of the output drive/program pads 30 is connected to a node 36. Each of the nodes 36 is operable to be connected to the output of a pad driver 38 or to the input of a program buffer 40. Each of the program buffers 40 is controlled by a program bias circuit 42, which program bias circuit 42 is operable to turn on each of the program buffers 40 and also receive control signals from a central processing unit (CPU) 46 through control fines 48. The CPU is also operable to input control lines on a line 49 to each of the program buffers 40. The outputs of each of the program buffers 40 are connected to one of a group of lines 50, which fines 50 are input to the register 52. Therefore, the outputs of the program buffers 40 are latched into a register 52, which can be read by the CPU 46 through a bus 54. The register 52 in effect appears as a dual port RAM. The CPU 46 is also operable to output the control signals to activate and control the drivers 38. The control signals are input on input lines 56 to the inputs of the drivers 38.

The CPU 46 is also operable to output a disable signal on a line 58, which is input to the enable circuit 60. The enable circuit 60 is operable to enable the external LED output device 14 on the line 16. When the system is operating in normal mode, and the output device 14 is driven, the line 16 is held high. When the program function is utilized and the program states on the drive/program pads 30 are sensed, the line 16 is held low.

FIG. 2 also illustrates one segment of the LED output device 14 comprised of an LED 64 having the cathode thereof connected to one of the output lines 12 associated with one of the pads 30, and the anode thereof connected to one side of the resistor 66. The other side of the resistor 66 is connected to the enable high line 16.

In operation, the system will either operate to drive the LED segments by pulling the pads 30 low with the driver 38, or the drivers 38 will be disabled and the program bias circuit 42 enabled to determine whether there is a pull up resistor, a pull down resistor or a floating input on each of the associated pads 30. The CPU controls this operation to load the value in the register 52. Thereafter, the CPU 46 can read the state of the register. It should be noted that the resistors 18 are always present in either a pull up or a pull down configuration. Since a pull down configuration must be sensed, no current can be supplied thereto through the LED 64 and, therefore, the line 16 must be high impedance. Although some current is drawn, this is minimal. Typically, the CPU 46 reads the program state upon receiving a power on reset signal or any type of user supplied reset signal through a serial input 69. A Power On Reset Circuit 70 is provided for prompting the CPU 46 to read the contents of the register 52 upon initialization and also control the program bias circuit 42 in order to effect proper loading of the program information into the register 52. However, the CPU 46 can read the output of any of the program buffers 40 whenever the input of the driver 38 is not enabled or, conversely, whenever the associated LED segment is not driven. Although the preferred embodiment illustrates a common program bias circuit 42, it should be understood that a separate program bias circuit could be utilized for each of the program buffers 40 and a separate enable high line 16 could be associated with each of the LED segments, although this would significantly increase the pin number.

Referring now to FIG. 3, there is illustrated a logic diagram for the driver 38. The driver 38 is comprised of an N-channel transistor 72, having the source/drain path thereof connected between the output pad 30 and a $V_{ss}$ line 74. The gate thereof is connected to one of the lines 56. A second N-channel transistor 76 has the source/drain path thereof connected between the output pad 30 and the $V_{ss}$ line 74, and the gate thereof connected to the $V_{ss}$ line 74. The transistor 76 is biased to an off state in this manner. This is a conventional configuration for a driver. It should be understood that any type of driver that allows the output pad to be pulled low and current to be sunk from the LED 64 will perform the appropriate operation.

Referring now to FIG. 4, there is illustrated a logic diagram for the program bias circuit 42. The control lines 48 are comprised of two control lines, an RPU line and an RPD line. The RPU input is connected to the gate of an N-channel transistor 80, the source/drain path thereof connected between a node 82 and the $V_{ss}$ line 74. The RPU input is also connected to the gate of a P-channel transistor 84, the source/drain path thereof connected between a power line 85 and a node 86. The RPD input is connected to the gate of an N-channel transistor 88, the source/drain path thereof connected between the node 82 and the $V_{ss}$ line 74. The RPD line is also connected to the gate of a P-channel transistor 90, the source/drain path thereof connected between the node 86 and the node 82. The node 82 is labelled RDPRC with the transistors 80, 88, 84 and.90 comprising a NOR gate.

The node 82, which comprises the output of the NOR gate, is connected to the gate of an N-channel transistor 92, the source/drain path thereof connected between a node 94 and the $V_{ss}$ line 74. Node 82 is also connected to the gate of a P-channel transistor 95, the source/drain path thereof connected between the power line 85 and a node 96. The node 94 is connected to the gate of a P-channel transistor 100, the source/drain path thereof connected between the node 96 and the node 94, such that the transistor 100 is connected in a diode configuration.

The node 94 is also connected to the gate of an N-channel transistor 104, the source/drain path thereof connected to the drain of transistor 100 and the $V_{ss}$ rail 74. The node 94 is also connected to the gate of a transistor 106, the source/drain path thereof connected between a node 108 and the $V_{ss}$ rail 74. A P-channel transistor 110 has the source/drain path thereof connected between the power line 85 and the node 108 and the gate thereof connected to the node 108. The node 108 comprises an output bias signal PRBP. The node 94 comprises an output bias signal PRBN.

In operation, when node 82 is low, transistor 92 is turned off and transistor 95 is turned on. Current therefore flows through transistor 95 and through transistor 100, transistor 100 being in a diode configuration. Transistor 104 is also connected in a diode configuration and, therefore, the PRBN signal will draw current through the source/drain path of transistor 95. This will cause transistor 106 to conduct and pull node 108 low, thus changing the voltage on the PRBP bias signal. Whenever the node 82 is high, transistor 92 is turned on, pulling node 94 low. This turns off both transistors 104 and 106 such that PRBN will be low and PRBP will be high.

Figures 5, 6:
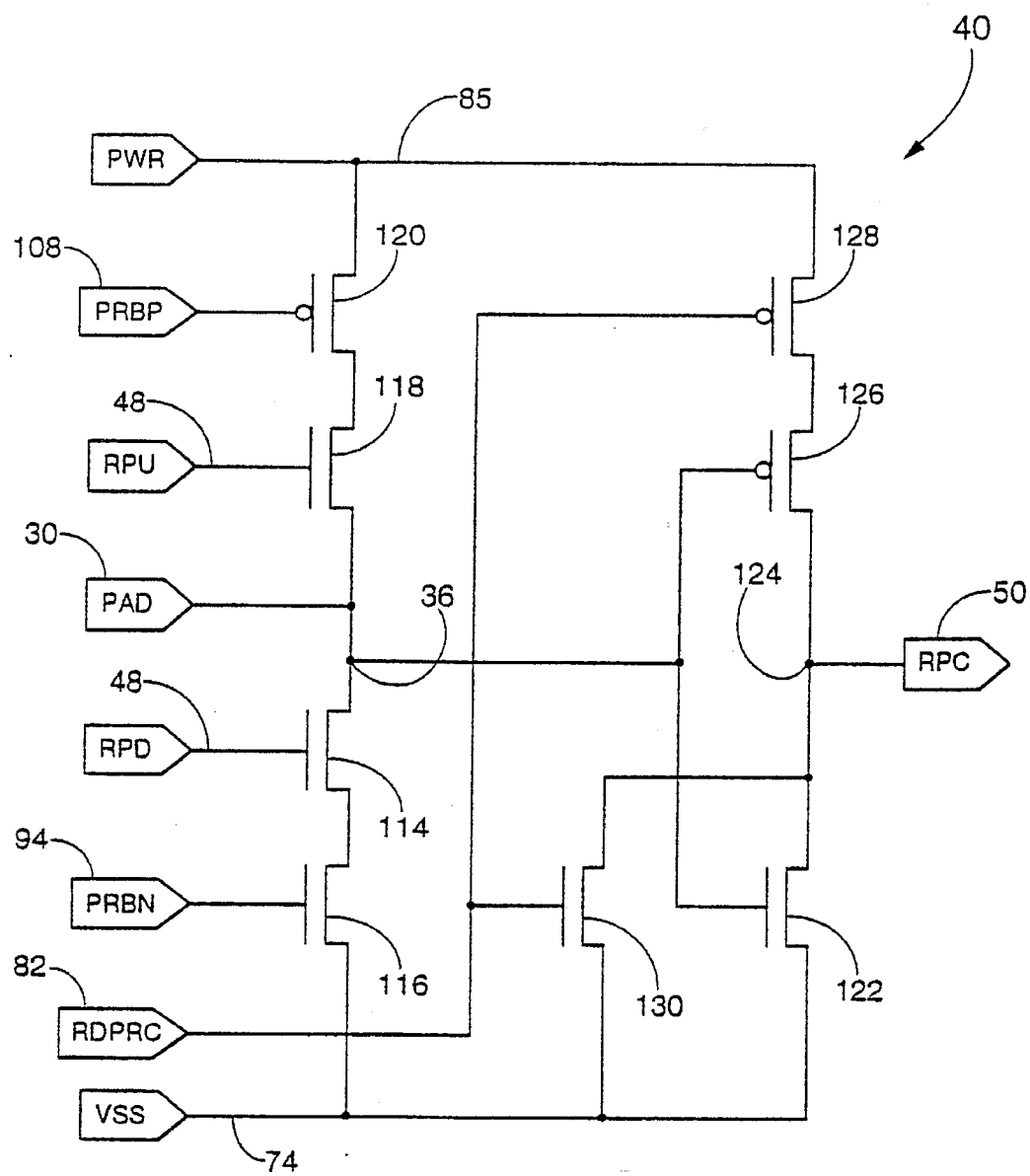
FIG. 5 illustrates a detailed diagram of the program buffer circuit for generating the program logic output signal.
FIG. 6 illustrates a truth table for the programming function.

Referring now to FIG. 5, there is illustrated a detailed schematic diagram of the program buffer 40. Two N-channel transistors 114 and 116 have the source/drain paths thereof connected in series and between node 36 and the $V_{ss}$ line 74. The gate of transistor 116 is connected to the PRBN signal on node 94, and the gate of transistor 114 is connected to the RPD input on line 48. An N-channel transistor 118 has the source/drain path thereof connected between the node 36 and one side of the source/drain path of a P-channel transistor 120. The gate of transistor 118 is connected to the RPU input signal on line 48. The other side of the source/drain path of the P-channel transistor 120 is connected to the power line 85, and the gate of transistor 120 is connected to the PRPB signal on node 108. The node 36 is connected to the gate of an N-channel transistor 122, the source/drain path thereof connected between a node 124 and the $V_{ss}$ rail 74. The node 124 comprises the output line 50 and is labelled RPC. Node 36 is also connected to the gate of a P-channel transistor 126, the source/drain path thereof connected between the node 124 and one side of the source/drain path of a P-channel transistor 128. The other side of the source/drain path of the P-channel transistor 128 is connected to the power rail 85 and the gate of transistor 128 is connected to the RDPRC signal on node 82. The RDPRC signal on node 82 is also connected to the gate of an N-channel transistor 130, the source/drain path thereof connected between the node 124 and the $V_{ss}$ rail 74.

In operation, whenever the RPU or RPD signals are present, the node 82 will be pulled low and RDPRC will be low. This is the read mode. In one mode, the presence of the pull down resistor is determined by raising the RPU signal high. In another mode, the presence of the pull up resistor is determined by pulling the RPD signal high. When the RPD signal is pulled high and there is no pull-up resistor connected, transistor 114 will be turned on, but transistor 118 will be turned off. If the pad 30 is floating meaning no pull-up or pull-down resistor is connected, transistor 114 and transistor 116 will both conduct and therefore will pull node 36 down and turn transistor 126 on in the absence of a pull-up resistor. Since transistor 128 is already turned on due to the RDPRC signal being pulled low, node 124 will be pulled high, constituting a logic 1 state. Therefore, for either a floating state or the presence of the pull down resistor, there will be a logic 1 state on the output line 50. If the pull up resistor is present, node 36 will be pulled high by the pull-up resistor and transistor 126 will be pulled up and transistor 126 will be turned off pulling node 124 low, constituting a logic 0 state. Therefore, the presence of a pull up resistor results in the presence of a logic 0 state on the output line 50.

Whenever the RPU signal is generated on line 48, transistor 114 will be turned off and transistor 118 will be turned on. If the node 36 is floating meaning it is not connected to a pull-up resistor or a pull-down resistor, transistor 118 will pull up node 36, turning off transistor 126 and turning on transistor 122. This will pull node 124 low and output a logic 0 state on node 50. The logic 0 state will be present on node 54 under the presence of a pull up resistor or a floating state. However, in the presence of a pull down resistor, node 36 will be pulled low, turning transistor 126 on and turning transistor 122 off. This will result in the output of a logic 1 state on the output line 50. Therefore, the program buffer 40 can determine the presence of three states on the output 30 merely due to the presence of a resistor. Further, these resistors can be present even during the driving operation. However, the pads cannot be driven through a pull down transistor and the program state read at the same time.

Referring now to FIG. 6, there is illustrated a truth table illustrating the logic state for the output line RPC in the presence of either the RPU signal being high or the RPD signal being high, and also as to what the state of the pad is, i.e., the presence of a pull up resistor, the presence of a pull down resistor, or a floating state. The presence of a pull up resistor or a pull down resistor is indicated by an X in the column, and when no X is present in either the column for the pull up resistor or the column for the pull down resistor, this indicates a floating state. Therefore, it can be seen that the presence of the RPU signal and a pull down resistor results in a logic 1 being output, whereas the presence of either a pull up resistor or a floating state results in the presence of a logic 0 output. Whenever RPD is high, a logic 0 will be output only when the pull up resistor is present, with a logic 1 being output when either the pull down resistor is present or a floating state is present. Therefore, the CPU 46 can ascertain what the logic state is merely by exercising each of the program buffers 40 with either the RPU signal or the RPD signal in two time periods and then reading the logic state output by the program buffer 40. This requires two cycles. For example, if the RPU signal were generated and the logic state were a logic 0, this would indicate either the presence of the pull up resistor or a floating state. By exercising the RPD signal, the logic 0 state would indicate the presence of a pull up resistor, and the logic 1 state would indicate the presence of a floating state, since the presence of a pull down resistor was eliminated when the RPU signal was exercised.

In summary, there has been provided an IC chip with programmable output drive/program pads. The output drive/program pads are programmed by either connecting a resistor from one of the output pads to a positive voltage rail or to a negative voltage rail, or by allowing the node to float. Therefore, a three state programming input is realized in a programming mode. The integrated circuit operates in a program read mode or in the drive mode. In the drive mode, the output drive/program pads are exercised to provide a driving signal. In the program read mode, the output circuitry is isolated by preventing current from flowing therethrough to the output pads. Current is then sunk from each of the pads to determine if the pull up resistor is present by monitoring the node and determining if the voltage on the node is pulled up. The presence of a floating state or a pull down resistor state will cause the node to be pulled low. The current is then sourced to the node to determine if a pull down resistor is present. If a pull down resistor is present, the node will be pulled low by the pull down resistor. When current is sourced to the node, a floating state or a pull up resistor will result in the node being pulled high. A CPU or microcontroller of the integrated circuit will be utilized to ascertain what the logic state is.

Although the preferred embodiment has been described in detail, it should be understood that various changes, substitutions and alterations can be made therein without departing from the spirit and scope of the invention as defined by the appended claims.

What is claimed is:

1. An integrated circuit with input/output pins for operating with multiple functions, comprising:

at least one multi-functional output pin for output control signals to an output load device having an associated impedance in a normal operating mode, and receiving program signals in a program mode;

a driver for driving said multi-functional output pin in said normal operating mode;

an internal program buffer for continuously determining from the electrical characteristics of said multi-functional output pin in said program mode whether a fixed program impedance is present on and connected directly to said multi-functional output pin between said multi-functional output pin and an external voltage reference which provides a first program state, or no program impedance is present on and connected directly to said multi-functional output pin between said multi-functional output pin and an external voltage reference which provides a second program state, thus determining which of said first and second program states is present; and a controller for selecting said program mode or said normal operating mode, said controller in said program mode operable to read the output of said program buffer and, in said normal operating mode, to control said driver to control said multi-functional output pin to generate said output control signals that are output to said output load device, said program impedance remaining directly connected to said muli-functional output while said driver is controlling said multi-functional output pin in said normal operating mode.

2. A method for programming an integrated circuit having a multi-functional output pin, comprising the steps of:

switching the mode of operation between a program mode and a normal operating mode, such that the integrated circuit may remain in either mode for an extended period of time;

in the normal operating mode:
driving an output load device having an associated impedance connected to the multi-functional output pin to activate the output load device;

in the program mode:
disabling the step of driving,
continuously accessing the multi-functional output pin and determining from the electrical characteristics on the multi-functional output pin if a program impedance is disposed directly between the multi-functional output pin and an external voltage with one side of the program impedance connected directly to the multi-functional output pin and the other side thereof connected directly to the external voltage, the presence of the program impedance indicating a first program state and the absence of the program impedance indicating a second program state,
generating a first signal if the program impedance is present on the multi-functional output pin,
generating a second signal if the program impedance is not present on the multi-functional output pin, and reading the first and second signal to determine the programming input during the program mode.

* * * * *